(12) United States Patent
Ballan et al.

(10) Patent No.: US 9,214,938 B2
(45) Date of Patent: Dec. 15, 2015

(54) CAPACITIVE SENSOR INTERFACE AND METHOD

(71) Applicant: Advanced Silicon SA, Lausanne (CH)

(72) Inventors: Hussein Ballan, Saint Legier (CH); Francois Krummenacher, Chatillens (CH)

(73) Assignee: Advanced Silicon SA (CH)

( * ) Notice: Subject to any disclaimer, the term of this patent is extended or adjusted under 35 U.S.C. 154(b) by 452 days.

(21) Appl. No.: 13/686,286

(22) Filed: Nov. 27, 2012

(65) Prior Publication Data

US 2013/0141139 A1   Jun. 6, 2013

(30) Foreign Application Priority Data

Dec. 2, 2011   (CH) ........................................ 1916/11

(51) Int. Cl.
*G06F 3/041* (2006.01)
*H03K 17/96* (2006.01)
*H03K 17/955* (2006.01)

(52) U.S. Cl.
CPC ............ *H03K 17/962* (2013.01); *H03K 17/955* (2013.01)

(58) Field of Classification Search
CPC ...................................................... G06F 3/041

USPC .................................................. 345/156–184
See application file for complete search history.

(56) References Cited

U.S. PATENT DOCUMENTS

| 6,452,514 | B1* | 9/2002 | Philipp ........................... 341/33 |
| 2008/0158169 | A1* | 7/2008 | O'Connor et al. ............ 345/173 |
| 2008/0204049 | A1* | 8/2008 | Kawate et al. ................ 324/679 |
| 2011/0102061 | A1 | 5/2011 | Wang et al. |
| 2011/0163768 | A1 | 7/2011 | Kwon et al. |
| 2011/0310054 | A1 | 12/2011 | Souchkov |

FOREIGN PATENT DOCUMENTS

WO   WO-2012034714 A1   3/2012

* cited by examiner

*Primary Examiner* — Carolyn R Edwards
(74) *Attorney, Agent, or Firm* — Blank Rome LLP

(57) ABSTRACT

Electronic interface and method for reading a capacitive sensor that includes one input capacitor (30) or several input capacitors, in which the capacitive sensor is excited with a two-level voltage ($V_{low}$, $V_{high}$) and read by a charge-sense amplifier whose output is sampled in four successive instants. An evaluation unit (333) is arranged to compute two difference values (V12, V34) between two pairs of samples corresponding to different voltage levels and to combine said difference values into an output value (V_out_raw) proportional to the charge transferred to the input of the charge-sense amplifier and an error value (error_bit) sensitive to a time derivative of a noise current $di_n/dt$.

13 Claims, 11 Drawing Sheets

CAPACITIVE SENSOR INTERFACE AND METHOD

REFERENCE DATA

The present application claims priority from Swiss patent application CH1916/11 of Dec. 2, 2011, the content whereof are hereby incorporated by reference.

FIELD OF THE INVENTION

The present invention concerns electronic capacity sensor and in particular, but not exclusively, devices that detect a variation in the capacitive couplings among an array of electrodes.

Embodiments of the present invention relate to touch-sensitive screens, track pads, and touch-sensitive input devices for computers.

Other embodiments of the invention relate to the use of capacitive sensors in other applications like proximity sensors, MEMS devices, accelerometers, position encoders and any application requesting to interface with capacitive sensors, and particularly to scan multiple capacitive sensors.

Aspects of the invention are an electric filter and the corresponding signal processing method used to extract inter-electrode capacity variations from an array of electrodes rejecting ambient electromagnetic noise.

DESCRIPTION OF RELATED ART

The circuits of FIGS. 1 and 2 are used in a variety of application fields that must sense minute capacity changes. The input capacitor 30, which may be realized by any suitable electrode arrangement, is connected between a constant potential (the ground in this case) and the input of a charge-sense amplifier 35. The input of the amplifier 35 is a virtual ground point, the feedback loop being arranged to keep its potential constant. The output of the amplifier 35 can be forced to a suitable reference value $V_{init}$ by a reset circuit, represented by the switch 352 in FIG. 2. After the reset, the output voltage will reflect the value of the input capacitor 30 according to the formula $V_{CSA}=V_{init}-Q/C_f$ where $C_f$ is the value of the feedback capacitor 355 and Q is the transferred charge. Any change in the charges stored into the sensing capacitor, resulting from a capacitance change for instance, will be seen as a voltage change at the output of the integrator. Various implementation schemes of the integrator stage are known in the art.

The block 40 is a low pass filter. Its purpose is to remove high frequency noise components from the measurement without significantly attenuating the transferred signal. The block 50 is a track and hold or a sample and hold circuit. It is required to store the result of the integrator at the end of the charge transfer phase and keep it available for the whole duration of the A/D conversion carried out in the ADC 80, in order to allow a new charge to be sampled while the current one is being converted.

FIG. 2 represents a readout circuit of a capacitive cell of a XY capacitive sensor matrix, as it could be integrated into a touch screen, a track pad, or any other suitable device. The input capacitor 30 represents the capacitance existing between a row 130 and a column 120 of electrodes that can be modified by an approaching finger, for example. The driver 32 applies a square pulse $V_r$ of determined amplitude to the electrodes 30 of each line (or column) of the matrix in order to inject a predetermined reference charge on the rising and falling edges of the pulses. The pulses can also be timed, as it will be seen further on, in order to interrogate sequentially the lines of the matrix.

The reference charges, also called reference charges without touch ($Q_{NT}$) are detected by the charge-sense amplifier 35 which amplifies and converts them in a voltage signal. The amount of charges is proportional to the mutual capacitance $C_{xy}$ between the X and Y electrodes of each coplanar capacitor of the projected capacitive matrix. When the user finger is close to the matrix surface, the coupled surface electric field of the coplanar capacitor will be modified, inducing a change of the mutual capacitance value $C_{xy}$, thus changing the coupled charges between the X and Y electrodes of the capacitor(s) located under the finger. The new amount of charges with touch, called $Q_T$, is detected and amplified during a new scan pulse. The difference between $Q_{NT}$ and $Q_T$ is the sampled touch signal which can be processed and converted. In a non-ideal real case, the output $V_{CSA}$ of the charge-sense amplifier will be affected not only by the user's finger, but also by environmental and intrinsic noise, represented by the current source 310. Noise introduces an error on the absolute $V_{CSA}$ level and can lead to various system errors. In the important case of capacitive touch application, false touches can be triggered by noise, depending on its level amplitude and spectral characteristics.

The CSA operation can be divided in three phases as illustrated in FIG. 3a. In this example, for simplicity, the noise source 310 is modelled as a constant DC current. The change of $C_{xy}$ capacitance is converted into a voltage through the CSA output ($V_{CSA}$). The reset period 102 corresponds to the reset switch 352 being closed, allowing $V_{CSA}$ to equal the reference voltage $V_{bias}$ (the offset being here neglected). The boundary between the noise integration period 104, and the voltage sampling period 106 is marked by a transition of the input drive level $V_r$ between two different constant values. In an ideal case where there is no leakage or noise current on $V_C$ the total charge being conserved the output $V_{CSA}$ reacts to a change in the driving voltage $V_r$ with a signal proportional to the charge transferred to its input, the gain being nominally equal to $-C_{xy}/C_{fb}$.

In the example of FIG. 3a, the noise current 310 contributes to the output with a constant slope ramp when the reset switch is open, and is the origin of the steps $\Delta V_1$ and $\Delta V_2$. The difference value 110 is given by $-V \cdot (V_{high}-V_{low}) \cdot C_{xy}/C_{fb} + (\Delta V_1 + \Delta V_2)$ where $(V_{high}-V_{low})$ is the amplitude of the drive voltage $V_r$.

FIG. 3b illustrates a known method of correcting the noise error ($\Delta V_1 + \Delta V_2$). The voltage acquisition cycle includes two opposite transitions of the driving signal $V_r$ and a sampling and holding scheme is in charge of generating two signals, $V_{sh1}$ and $V_{sh2}$ that store the sampled value of the $V_{CSA}$ output for the first and second part of the acquisition phase respectively. Assuming a good correlation of the noise contribution in between two consecutive samples, the difference between the two sampled and held signals $V_{sh1}$ and $V_{sh2}$ does not contain the DC and low frequency noise contributors anymore. In addition, when a real capacitive change occurs, the sign change in the driving signal gives rise to useful signals which are in phase opposition on $V_{sh1}$ and $V_{sh2}$ such that the difference between the two variables exhibits a 6 dB gain with respect to the capacitance variation.

The above method and circuit provide satisfactory elimination of DC offsets and low frequency noise (e.g. 1/f noise or noise coming from the mains). High frequency noise, on the other hand, can be effectively mitigated by low-pass filter 40, or equivalent signal processing techniques.

Known circuits, for example those disclosed in documents U.S. 2011163768 and U.S. 2011102061, still have unsatisfactory rejection of for medium frequency noise events such that coming from switching devices such as power supplies, lighting lamps and backlights, in particular if the noise between two consecutive samples is uncorrelated.

It is therefore an aim of the present invention to provide a novel capacitive touch sensor circuit, as well as the corresponding filter and processing method that can extract a signal from a capacitive sensor and has a better immunity to noise.

BRIEF SUMMARY OF THE INVENTION

According to the invention, these aims are achieved by means of the objects of the appended claims.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 4A:
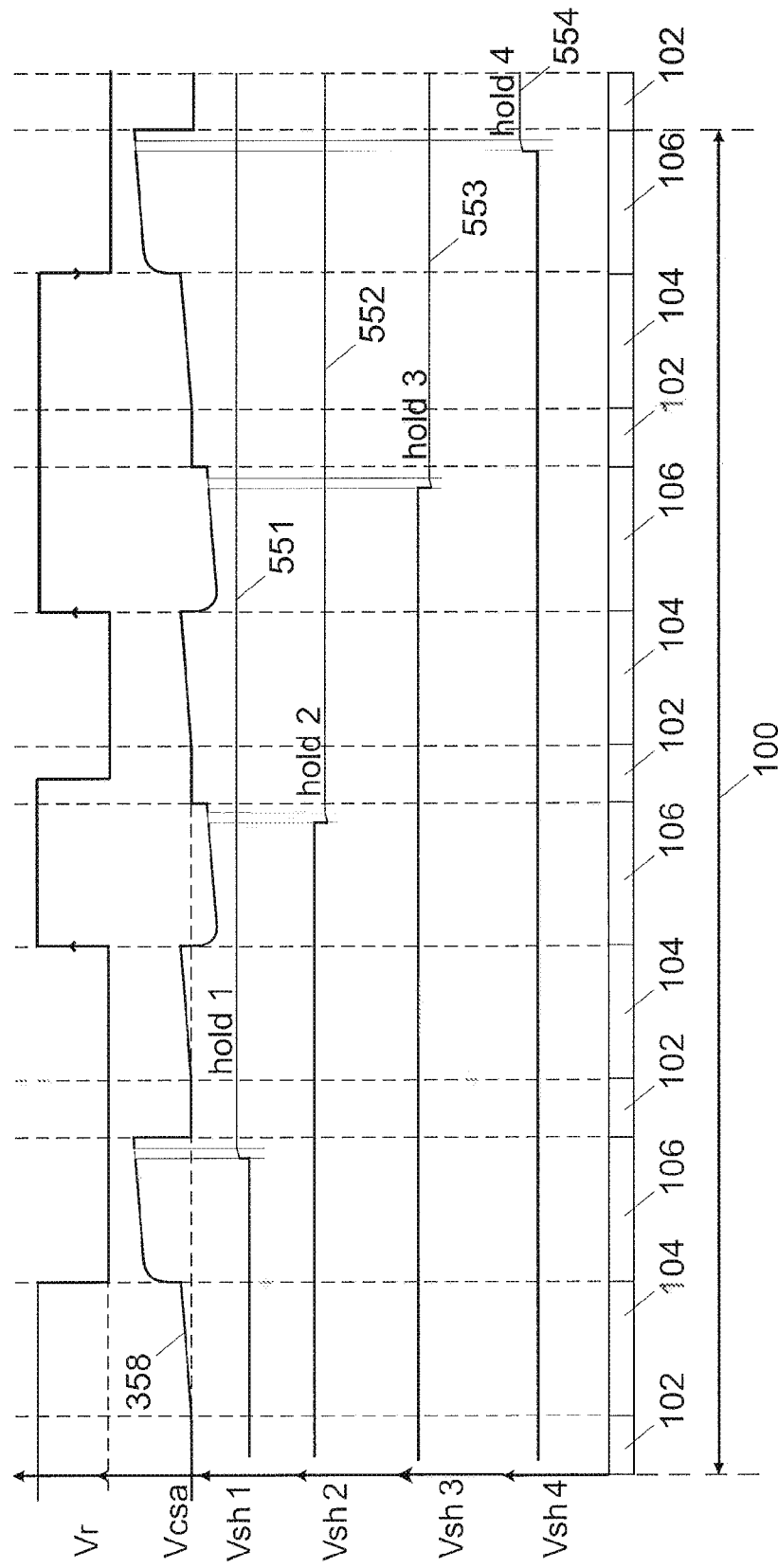
FIGS. 4a and 4b show the readout cycle of a sampling scheme according to an aspect of the invention.

Referring now to FIG. 4a, in an aspect of the present invention four consecutive samples of $V_{CSA}$ are generated corresponding to positive, negative, negative then positive integration respectively $V_{sh1}$, $V_{sh2}$, $V_{sh3}$, and $V_{sh4}$. The wording 'positive integration' and 'negative integration' refers to the polarity of the signal present on $V_{CSA}$ and, to the values of the drive excitation voltage $V_f$. Let's assume for example that the drive voltage $V_f$ can assume two values, $V_{low}$ and $V_{high}$ when $V_f$ switches from $V_{high}$ to $V_{low}$, a negative charge ($V_{low}$−$V_{high}$). $C_{xy}$ is injected at the input of the charge-sense amplifier 35, and the output $V_{CSA}$ exhibits a positive step; conversely, the transition of $V_f$ from $V_{low}$ to $V_{high}$ corresponds to a negative $V_{CSA}$ step. The invention, however, could also rely on the complementary logic, and take four samples corresponding to negative, positive, positive and then again negative integration. In a generalization, the samples $V_{sh1}$, $V_{sh2}$, $V_{sh3}$, and $V_{sh4}$ could include two samples corresponding to $V_{low}$ and two samples corresponding to $V_{high}$ in a different order. According to an important aspect of the invention, the output $V_{CSA}$ is reset (periods 102) to a predetermined reference value after the sampling of $V_{sh1}$, $V_{sh2}$, $V_{sh3}$, and $V_{sh4}$.

Let's now assume that the sampling frequency $F_s=1/T$ is sufficiently faster than the Nyquist frequency associated with the incoming noise. Let's call U the useful signal:

$$U = (Vhigh - Vlow)\frac{C_{xy}(nT)}{Cfb}$$

Figure 1:
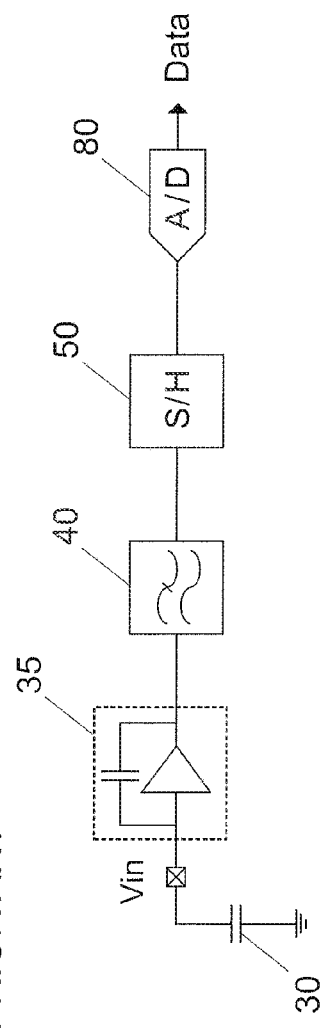
FIG. 1 shows schematically a generic capacitive sensor readout.
Figure 2:
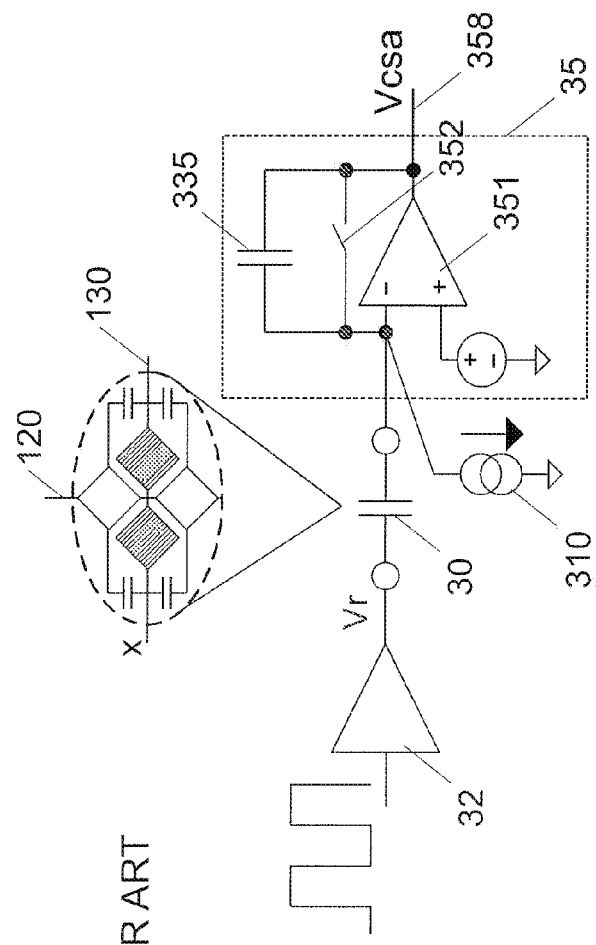
FIG. 2 represents an array of capacitive sensors and the corresponding readout circuitry.
Figure 3A:
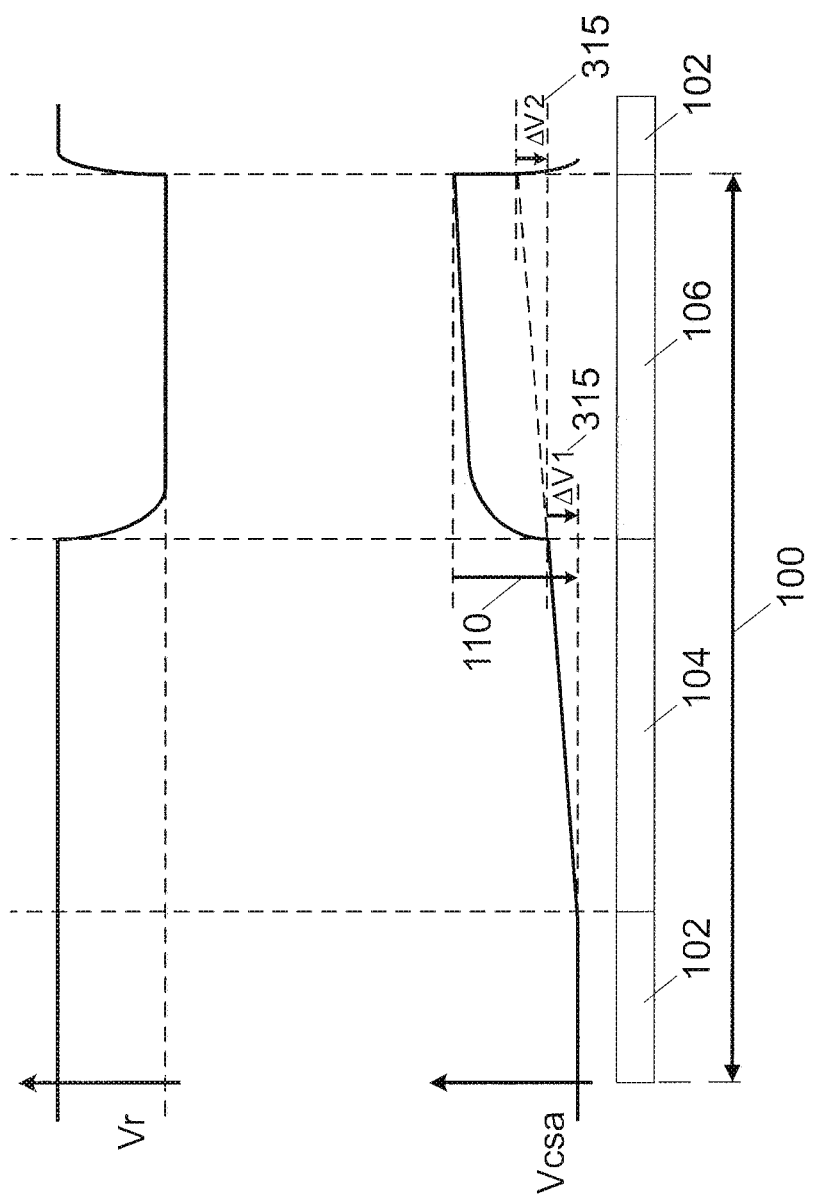
FIGS. 3a and 3b illustrate schematically the principal electric signals of the circuit of FIG. 2, including the effect of low-frequency noise, and an alternate sampling scheme.
Figure 3B:
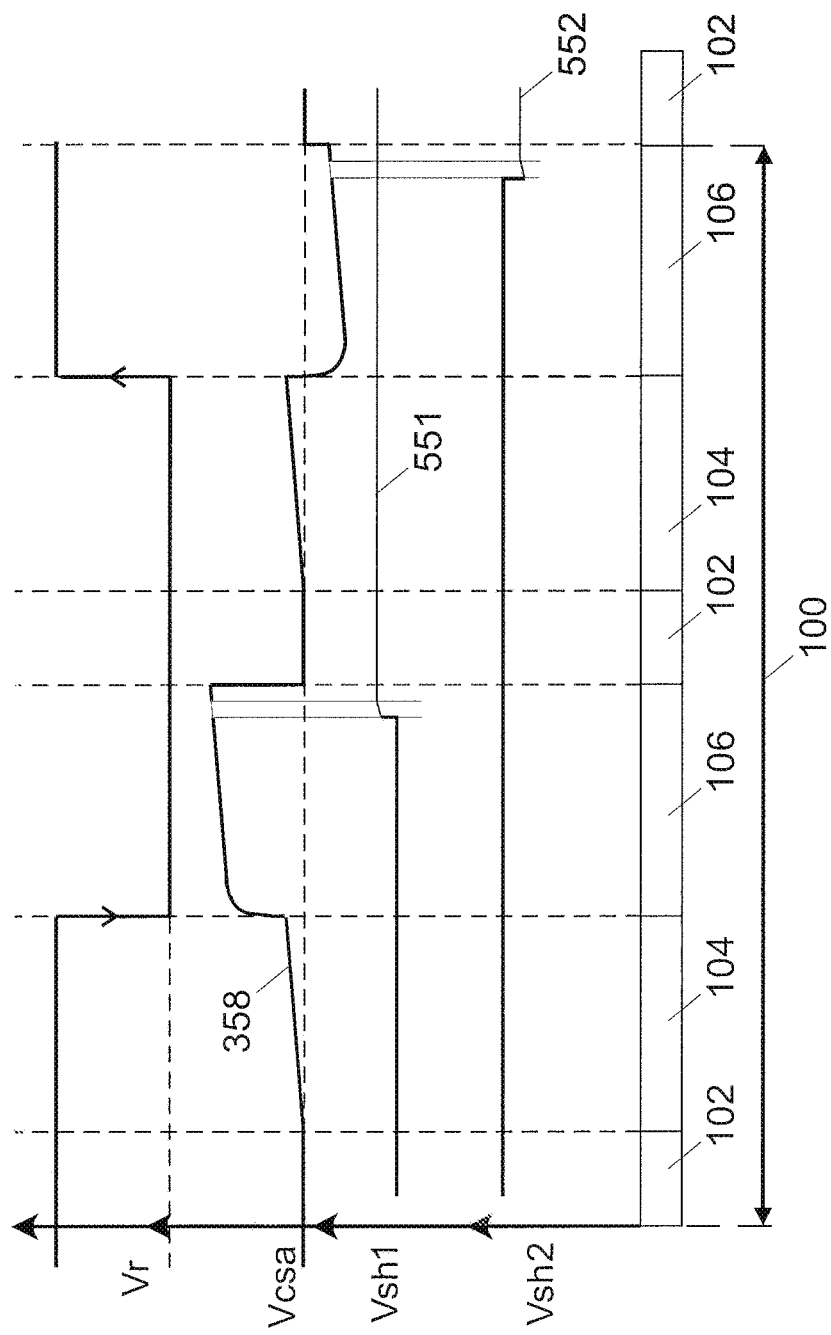

Let's assume that the noise signal N(t) has the form of a current $i_n(t)$ connected to the input of the integrator (see FIG. 2). We can then write the expression for one S/H output during the nth positive integration period during which it is activated. Noting that during the reset period 102, there is obviously no integration taking place such that the average noise current $i_n(t)$ during a period starting at (n−1)T and ending at nT should actually start at ((n−1)·T+T_r);

$$Vsh_p(nT) = Vbias + U + \frac{(\bar{i}_n((n-1)T + Tr \to nT))(T - Tr)}{Cfb}$$

$$U = (Vhigh - Vlow)\frac{\int_{(n-1)T+t_r}^{nT} i_n(t)dt}{Cfb}$$

If, for simplification, we assume that the noise current exhibits a linear relationship with respect to time, or more generally if the noise signal can be substituted by its first derivative during at least one quadruple sampling period, preferably during several quadruple sampling periods, we can write:

$$i_n(t) = \alpha \cdot t$$

We also note from FIG. 4a that the global period of each of the four SH signals (Vsh1, 2, 3, 4) is 4·T. Substituting $i_n(t)$ by its value from equation above, we can find the two consecutive samples from a given S/H output corresponding to a positive integration and finally their difference:

$$Vsh_p(nT) = Vbias + U - \frac{\alpha\left(\frac{T^2 + Tr^2}{2} + T \cdot Tr \cdot (n-1) - nT^2\right)}{Cfb}$$

$$Vsh_p((n-4)T) = Vbias + U - \frac{\alpha\left(\frac{9T^2 + Tr^2}{2} + T \cdot Tr \cdot (n-5)nT^2\right)}{Cfb}$$

Hence the difference:

$$Vd_p(nT) = \frac{4\alpha(T^2 - T \cdot Tr)}{Cfb}$$

If now we focus on the $(n+1)^{th}$ sample which corresponds to a negative integration, we can similarly express the difference between the two consecutive samples from the concerned SH output:

$$Vsh_p((n+1)T) = Vbias + U - \frac{\alpha\left(\frac{Tr^2 - T^2}{2} + T \cdot Tr \cdot n - nT^2\right)}{Cfb}$$

$$Vsh_p((n-3)T) = Vbias + U - \frac{\alpha\left(\frac{7T^2 + Tr^2}{2} + T \cdot Tr \cdot (n-4) - nT^2\right)}{Cfb}$$

And the difference:

$$Vd_n((n+1)T) = \frac{4\alpha(T^2 - T \cdot Tr)}{Cfb}$$

Figure 4B:
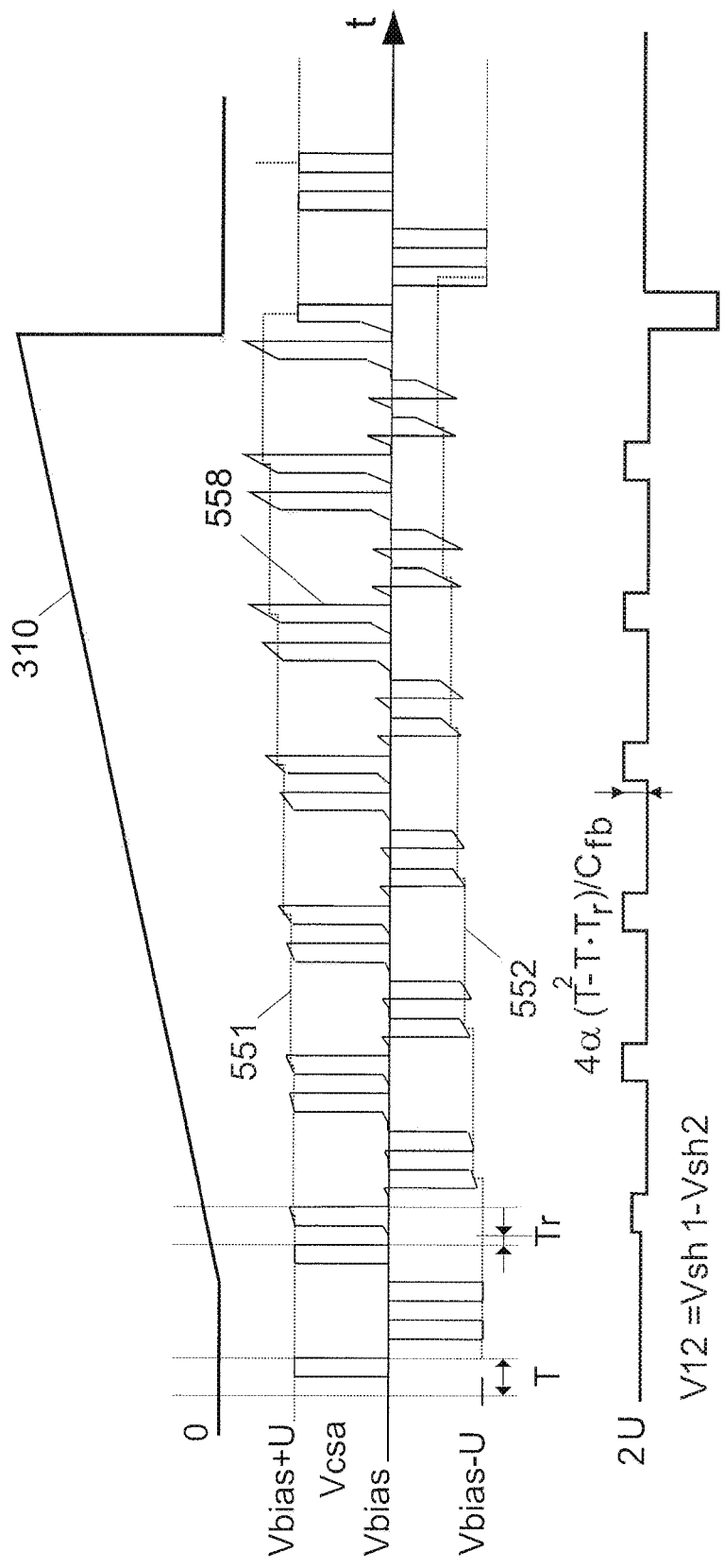
Figure 5A:
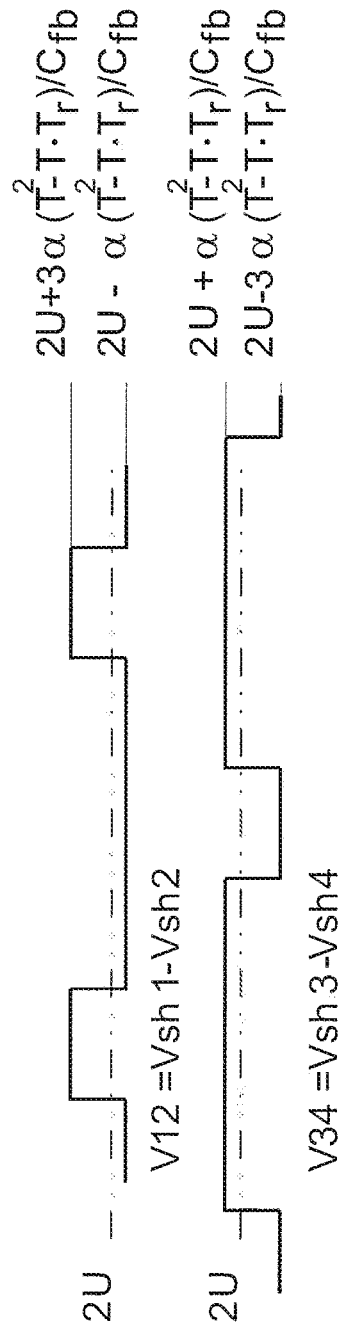
FIGS. 5a and 5b illustrate other signals used in various embodiments of the invention.

From equations on $Vd_p$ and $Vd_n$, we notice that in steady state, the step between two outputs of each SH is constant and independent of the sampling index, it is also proportional to the slope of the incoming noise signal. Let's define now $V12 = V_{sh1} - V_{sh2}$, as the difference between two S/H outputs corresponding to different values of the drive excitation voltage $V_f$, $V12 = V_{sh1} - V_{sh2}$, will be a square wave of peak to peak value as defined by $Vd_p$ and $Vd_n$, of period $4 \cdot T$ and mean value of $2 \cdot U$ as FIGS. 4b and 5a illustrate.

A similar analysis can be conducted for the two other S/H outputs $V_{sh3}$ and $V_{sh4}$. Using the same starting assumptions, we obtain:

$$Vd_n((n+2)T) = \frac{4\alpha(T^2 - T \cdot Tr)}{Cfb}$$

$$Vd_p((n+3)T) = \frac{4\alpha(T^2 - T \cdot Tr)}{Cfb}$$

Taking now the difference between these two S/H outputs $V_{34} = V_{sh3} - V_{sh4}$, which also correspond to different values of the drive excitation voltage $V_f$, we obtain in steady state a square wave of same peak to peak value as for signal V12, still a mean value of $2 \cdot U$ but because of the inversion of the integration sign (negative for phase (n+2)T then positive for phase (n+3)T), we can observe a duty cycle of 75% for the case of a positive noise $i_n(t)$. This is shown in FIG. 5a. Clearly in case of negative noise, the signals V12 and V34 would exhibit 75% and 25% duty cycle respectively.

Figure 5B:
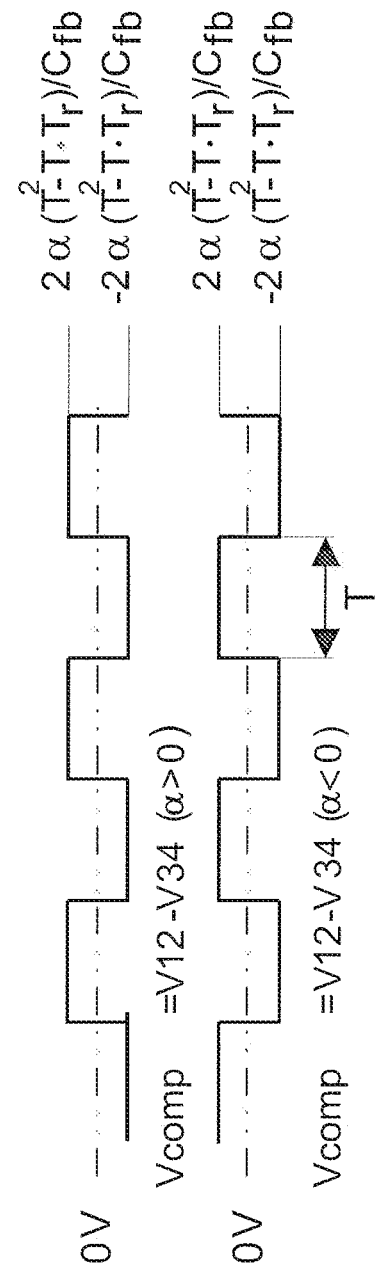

According to an aspect of the present invention, the signal $V_{comp} = V12 - V34$ is generated by combining two square waves defined above in order to obtain a signal proportional to the charge transferred to the input of the charge-sense amplifier (the signal $V_{comp}$ is defined as the result of a subtraction but, clearly, if one permutes the terms in the definition of V12 and V23, an addition or a different combination would be needed to arrive at the same algebraic value). Thanks to the alternate integration sign, the steady $V_{comp}$ signal during a time linear noise always exhibit a 50% duty cycle pattern centred at 0V. This is shown in FIG. 5b.

Figure 6:
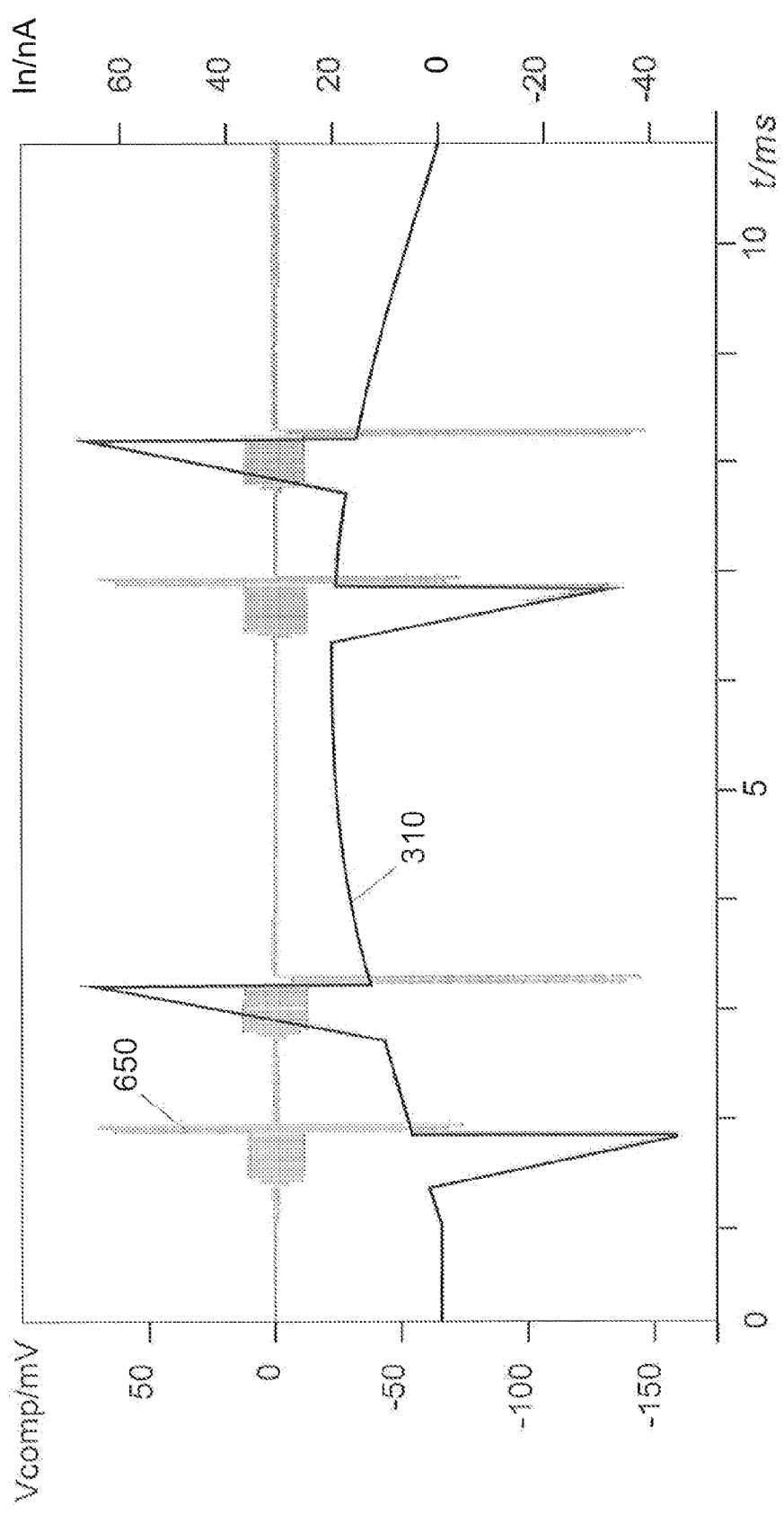
FIG. 6 relates to a situation including several sources of environment noise.

FIG. 6 represents, in function of time, a noise current signal 310 comprising a low-frequency sine wave component that represents for example a noise at mains frequency with superimposed triangle noise spikes as coming from a switched power supply or a backlight panel, or lamps, for example, and the corresponding $V_{comp}$ signal 600.

As expected, the $V_{comp}$ signal exhibits a 0V mean value with square waves and pulses corresponding to the incoming noise current. When the noise current varies linearly or quasi-linearly with time and when the quadruple S/H system can correctly track the noise, then the peak to peak amplitudes are proportional to its first derivative as explained in the beginning of this section. For fast transients as seen at the end of the noise pulses, the $V_{comp}$ samples no longer exhibit constant amplitude square waves but rather several larger amplitudes spikes, corresponding to the high involved noise $di_n/dt$.

Having a well defined average level of 0V affected by bidirectional spikes proportional to noise $di_n/dt$, the composite signal $V_{comp}$ can be considered as a reference level for medium frequency noise detection and elimination.

Figure 7:
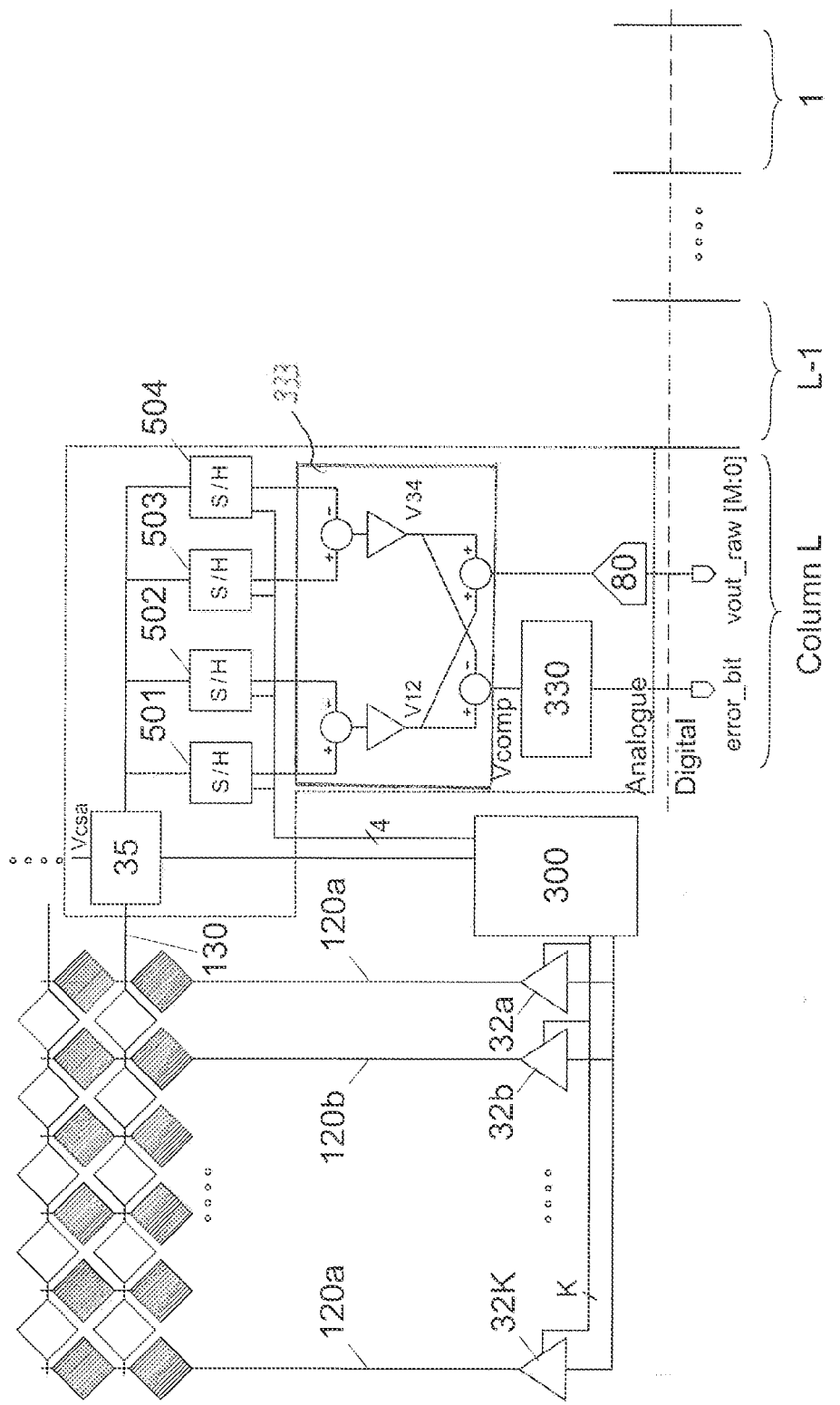
FIG. 7 illustrates schematically a touch sensitive capacitive array device according to an aspect of the present invention.
Figure 8:
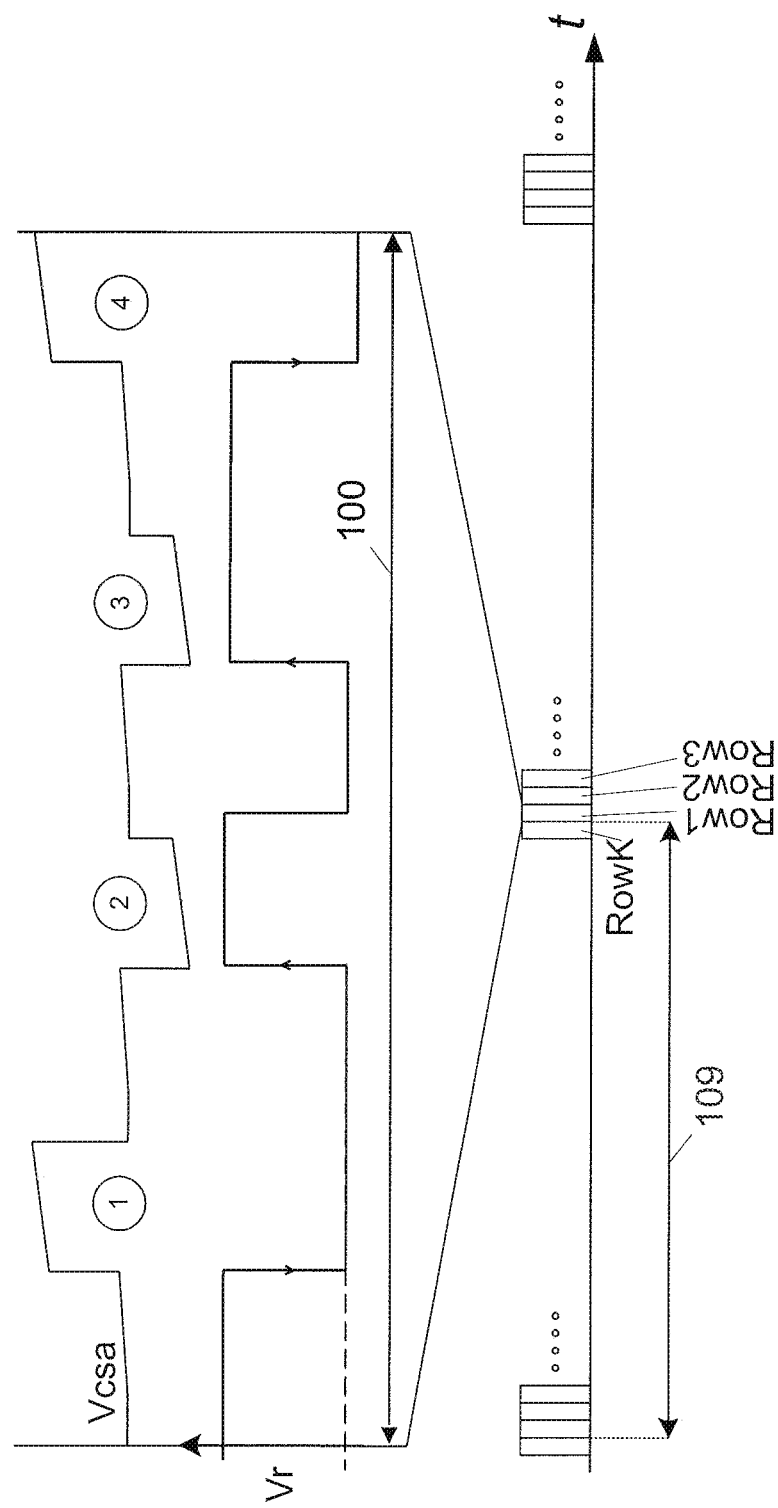
FIG. 8 relates to the organization of a scanning cycle in the device illustrated in FIG. 7.

In an actual touch panel system, "L" Charge Sensing Amplifiers are hooked to "L" columns which intersect with "K" rows. FIG. 7 shows the block diagram for one column of a possible implementation of the proposed system. It includes a XY array of electrodes connected together in columns 130, and rows 120a-120k. The rows are connected each to a row driver 32a-32k having an analogous function to the driver 32 of FIG. 2. The columns, (of which only one is represented for clarity's sake) are coupled to a readout circuit including a charge-sense amplifier 35 as in FIG. 2, and four sample/hold circuits 501, 502, 503, 504. A timing circuit 300 generates the necessary timing signals to enable the row drivers 32a-32k sequentially in a scanning cycle 109, and also commands the reset of the CSA 35 and triggers the operation of the sample/hold circuits 501, 502, 503, 504. The timing is illustrated by FIG. 8.

The evaluation unit 333 generates through addition and subtraction of the four outputs of the sample/hold circuits, the functions V12, V34 and $V_{comp}$=V12-V34 as explained above. The evaluation unit further generates an analogue signal $V_{out\_raw}$ proportional to the charge transferred to the input of the charge-sense amplifier. $V_{out\_raw}$ is fed to an ADC 80 that generates a (M+1) bit word $V_{out\_raw}$[M:0]. In the presented example $V_{out\_raw}$=V12+V34 which provides a gain of 4 (12 dB) with respect to the useful signal. The samples $V_{sh1}$, $V_{sh2}$, $V_{sh3}$, and $V_{sh4}$. contribute to $V_{out\_raw}$ with weights equal to +1 for the positive samples $V_{sh1}$ and $V_{sh3}$ and to -1 for the negative samples $V_{sh2}$ and $V_{sh4}$.

According to the particular embodiment represented schematically in FIG. 7, the sample-and-hold 501, 502, 503, 504 are operationally arranged to hold four samples $V_{sh1}$, $V_{sh2}$, $V_{sh3}$, and $V_{sh4}$ of the output of the charge-sense amplifier 35. It must be understood, however, that the present invention is not limited to the case of four physically separate sample-and-hold, and that the same could be obtained by a lower number of time-multiplexed units. In a particularly simple realization, the output of $V_{CSA}$ is digitized by a single sample-and-hold and ADC circuit, timed to sample and acquire the four samples $V_{sh1}$, $V_{sh2}$, $V_{sh3}$ and $V_{sh4}$ serially. The evaluation of $V_{comp}$=V12-V34 and $V_{out\_raw}$=V12+V34 is then carried out on the digital values by a hardwired logic circuit, or by a DSP.

A discriminator block 330 is in charge of generating a digital flag (error_bit), each time the magnitude of $V_{comp}$ has overcome a pre-defined threshold, thereby indicating that the value of signal $V_{out\_raw}$ is affected by a current noise exceeding a certain slope ($di_n/dt$).

According to a variant of the invention, the system could include a parallel ADC arranged to convert $V_{comp}$=V12-V34 in noise samples which are a representation of the noise ($di_n/dt$), while $V_{out\_raw}$, digitized by the main ADC 80, provides a digital representation of signal+noise. Further signal processing can be used to obtain a noise-subtracted signal. Equivalently, the system could include two ADC arranged to convert the signals $V12=V_{sh1}-V_{sh2}$ and $V34=V_{sh3}-V_{sh4}$, from which the signal and the noise are obtained arithmetically, as seen above.

Figure 9:
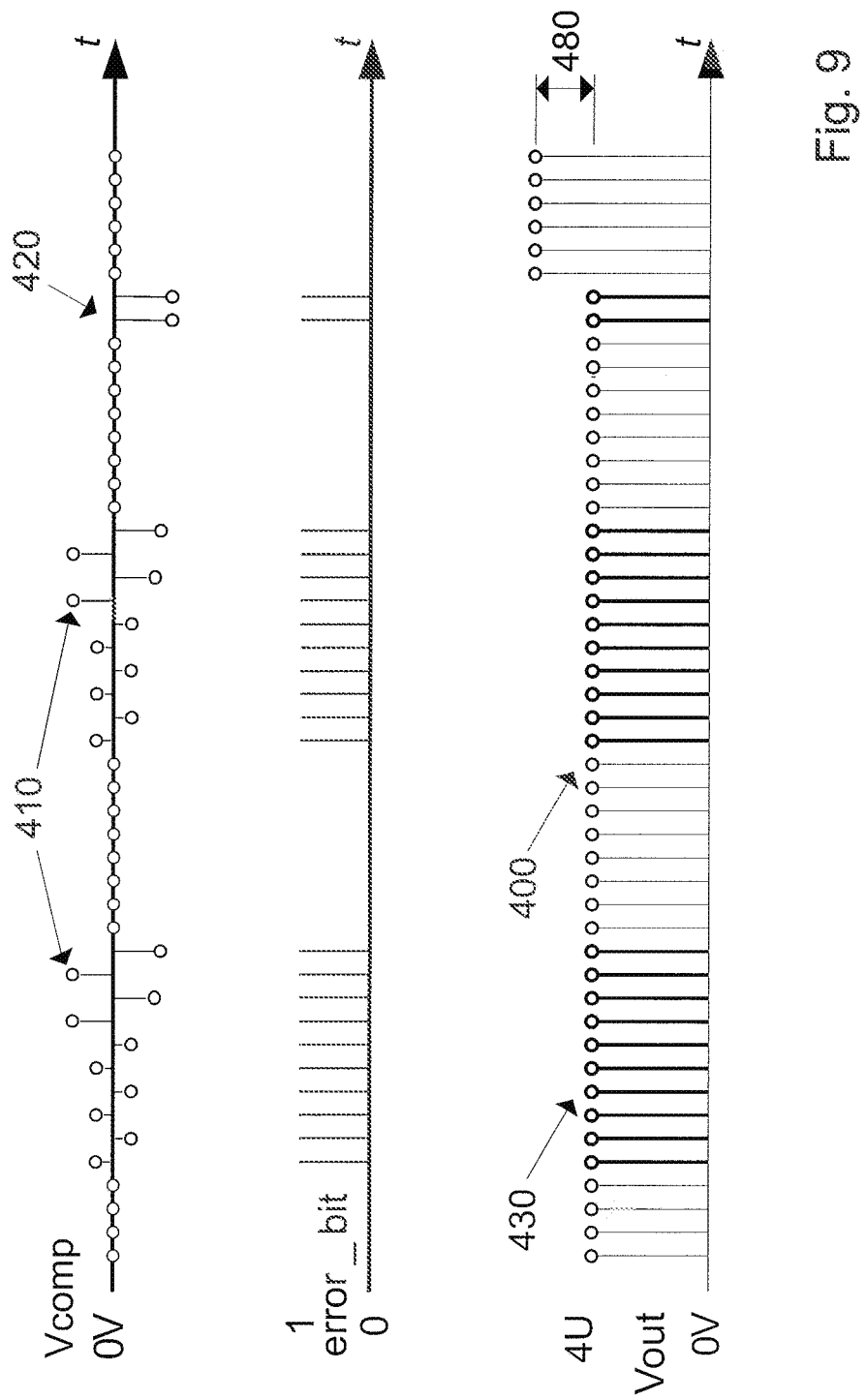
FIG. 9 shows the data format and error-signal flags generated by the circuit of FIG. 7.
Figure 10:
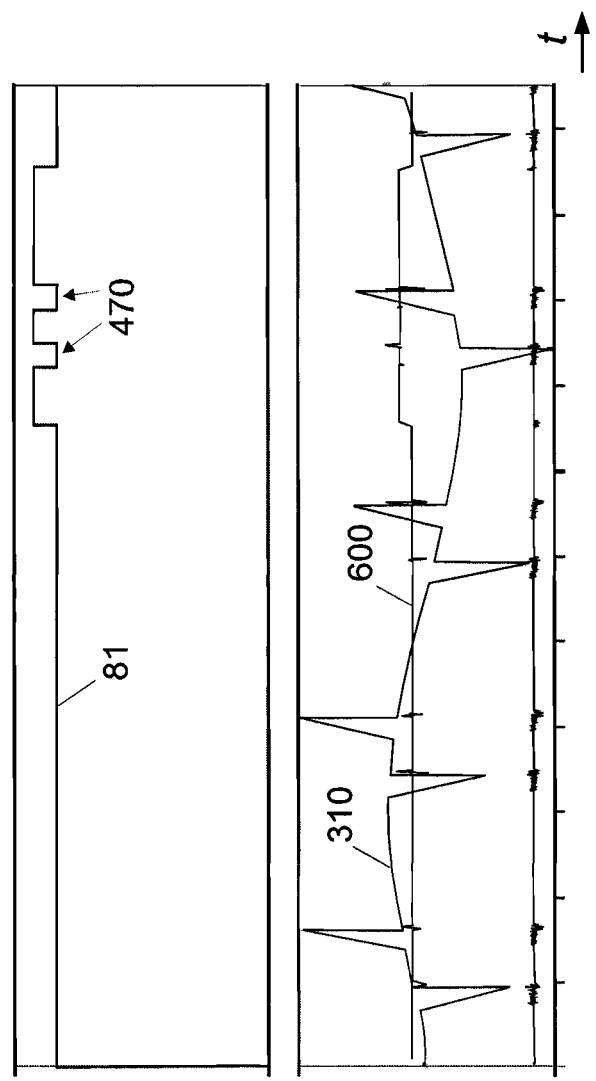
FIG. 10 shows an example of performance of an embodiment of the present invention in presence of various noise sources.

Once the samples impacted by noise have been identified thanks to the error_bit digital flag, further processing can take place to eliminate and/or replace the concerned converted samples from $V_{out\_raw}$ in order to obtain the output signal $V_{out}$. Several techniques are possible, placing more or less constraints on the digital processing. In FIG. 9, a straight replacement of missing samples by a default value is shown. This straight substitution approach is effective and is simple to implement, but signal drops 470 visible in FIG. 10 can be introduced if noise pulses occur during the touch itself. In many significant applications where the capacitive touch sensor is actually a 2D device, the effect of these drops can be mitigated my known digital image processing techniques like in-painting for example.

The invention claimed is:

1. Electronic interface for reading a capacitive sensor that includes one input capacitor or several input capacitors whose capacitance depends from a value that must be measured, the interface including at least one driver generating an electric excitation voltage that varies between a first voltage level and a second voltage level connected to one electrode of the input capacitor, and a charge-sense amplifier connected to another electrode of the input capacitor and arranged to output a signal proportional to the charge transferred to the input of the charge-sense amplifier, the interface comprising:
   sampling means operationally arranged to hold four samples of the output of the charge-sense amplifier,
   a timing circuit triggering determining the instants of said four samples and the excitation generated by said driver such that two of said four samples correspond to said first voltage level, while the two other samples correspond to said second voltage level, and
   an evaluation unit arranged to compute two difference values between two pairs of samples corresponding to different voltage levels and to sum up said difference values into an output value proportional to the charge transferred to the input of the charge-sense amplifier.

2. The electronic interface circuit of claim 1, wherein the evaluation unit is further arranged to combine said difference values into an error value sensitive to a time derivative of a noise current.

3. The electronic interface circuit of claim 2, wherein the error values identifies samples impacted by noise.

4. The electronic interface circuit of claim 1, in which the charge-sensitive amplifier includes as well reset means arranged to force the output of the charge-sensitive amplifier to a determined reference value.

5. Combination of the electronic interface circuit of claim 1 with a capacitive touch sensitive device comprising a plurality of input capacitors organized in rows and columns to form a 2D array, the electronic interface circuit being arranged to scan the capacitors and provide signals indicative of the position of one or more fingers touching the touch sensitive device.

6. The combination of claim 5, wherein the electronic interface circuit comprises an evaluation unit arranged to compute two difference values between two pairs of samples corresponding to different voltage levels and to combine said difference values into an output value proportional to the charge transferred to the input of the charge-sense amplifier, and into an error value sensitive to a time derivative of a noise current, wherein the error values identifies samples impacted by noise, and comprising a digital processor arranged to replace the samples impacted by noise by a predetermined default value.

7. The combination of claim 6, further comprising a digital image processor.

8. The electronic interface of claim 1, wherein the sampling means comprises four analogue sample-and-hold circuits for collecting the four samples, wherein the evaluation unit is analogue.

9. Method of reading a capacitive sensor, comprising: applying an excitation voltage that varies between a first voltage level and a second voltage level connected to one electrode of the capacitive sensor, reading the charge transmitted by the capacitive sensor by a charge-sense amplifier, collecting four samples of the output of the charge-sense amplifier at instants determined such that two of said four samples correspond to said first voltage level, while the two other samples correspond to said second voltage level, and computing two difference values between two pairs of samples corresponding to different voltage levels and summing up said difference values into an output value proportional to the charge transferred to the input of the charge-sense amplifier.

10. The method of claim 9, comprising combining said difference values into an error value sensitive to a time derivative of a noise current.

11. The method of claim 10, comprising identifying samples impacted by the noise based on said error value.

12. Use of the method of claim 9 in reading a capacitive touch sensitive device comprising a plurality of input capacitors organized in rows and columns to form a 2D array.

13. The method of claim 9, wherein the four samples are collected by four analogue sample-and-hold circuits, wherein the computation of the two difference values and the summation of said difference values are realized in an analogue circuit.

* * * * *